United States Patent [19]

Whelan

[11] 4,056,795
[45] Nov. 1, 1977

[54] WIPER CONTACT FOR TURRET-TYPE VARACTOR CONTROLLER

[75] Inventor: Robert D. Whelan, West Springfield, Mass.

[73] Assignee: General Instrument Corporation, Clifton, N.J.

[21] Appl. No.: 700,959

[22] Filed: June 29, 1976

[51] Int. Cl.$^2$ .......................... H03J 3/18; H01C 10/42
[52] U.S. Cl. ............................... 334/15; 74/424.8 A; 338/180
[58] Field of Search .......... 334/15; 74/89.15, 424.8 R, 74/424.8 A; 338/96, 180, 181

[56] References Cited

U.S. PATENT DOCUMENTS

| | | | |
|---|---|---|---|
| 2,945,199 | 7/1960 | Mucher et al. | 338/180 |
| 2,958,841 | 11/1960 | Garstang | 338/180 |
| 3,679,980 | 7/1972 | Midgley et al. | 334/15 X |
| 3,743,976 | 7/1973 | Meyer et al. | 334/15 X |
| 3,868,621 | 2/1975 | Kitamura et al. | 338/180 |
| 3,987,389 | 10/1976 | Nishioka et al. | 338/180 |

Primary Examiner—Paul L. Gensler
Attorney, Agent, or Firm—James & Franklin

[57] ABSTRACT

The base portion of the wiper contact is deformable to assure continuous electrical connection between a lead screw and the aligned resistive strip located on the surface of the turret, as the contact is inserted therebetween. The strip engaging portion is located on the resilient base portion approximately midway between the guide portion and thread engaging portion such that the deformation causes the contact to exert substantially balanced forces on the lead screw. The structure of the guide portion of the contact is designed to enhance mechanical stability by preventing dislodgement of the contact without the necessity for cooperation with other external parts which obstruct visibility of the position indicating member, which is mounted on the contact and extends over the entire width thereof. In addition, means are provided to prevent the relative lateral movement between the contact and the lead screw during lead screw "runoff".

13 Claims, 6 Drawing Figures

WIPER CONTACT FOR TURRET-TYPE VARACTOR CONTROLLER

The present invention relates generally to tuning assemblies for use in communications systems and, more particularly, to a wiper contact for use in a varactor controller.

A varactor tuner incorporates a signal controlled element which serves to regulate a resonant frequency circuit to select a desired frequency. The signal controlled element may comprise one or more voltage controlled capacitors, commonly called varactors. The capacitance of a varactor is variable in accordance with the input voltage thereto. Thus, when the varactor is placed in a resonant frequency circuit, the resonant frequency thereof will be regulated by the capacitance of the varactor, which, in turn, is determined by the input voltage signal thereto.

Such a system, as is well known in the art, has advantages over conventional gang tuned capacitor or inductor-type tuners, as it requires no mechanically operated capacitors or inductors whose characteristics may vary undesirably due to the wearing of the parts after substantial use or the presence of foreign matter such as dust particles trapped between the moving parts. A varactor tuner must, however, be utilized in conjunction with a component, called a controller, which accurately generates or controls the input voltage to the voltage controlled tuning elements. Such a controller must perform the voltage generating function with accuracy sufficient to provide the necessary fine tuning capability and, in addition, be capable of retaining information to the precise magnitude of the voltage required to coarse and fine tune the varactor tuner to the necessary frequencies corresponding to each of a plurality of different channels within the reception range of the communications receiver.

One type of controller for a varactor tuner which has been utilized comprises a component, such as a rotatable drum or turret, which is positionable in accordance with the frequency desired to be selected by the varactor tuner. As each position is selected, a different variable resistance element, carried on the turret, is operably electrically connected into the voltage generating circuit. The magnitude of the resistance of each of the resistive elements can be mechanically varied to provide the necessary coarse and fine tuning voltage corresponding to the selected position. The mechanical means for varying the resistance of the element is designed to remain set at a particular value until changed, so that each time the channel corresponding to the particular resistive element is tuned, the previously set value of that resistance element will cause the circuit to generate the necessary voltage.

An example of this type of varactor controller is disclosed in detail in application Ser. No. 671,821, filed Mar. 30, 1976, entitled CONTROLLER FOR A VARACTOR TUNER, in the names of Robert D. Whelan and Richard D. Gibson, and assigned to the assignee herein. In that controller, the resistance elements are formed as a plurality of resistance strips on an insulating base, which is then placed on the external surface of the turret. Above each strip is an independently rotatable lead screw. A separate wiper contact is placed between each lead screw and the corresponding resistive strip and is movable along the lead screw in accordance with the rotation thereof. The lead screw is conductive and is electrically connected to the output of the controller. The contact serves to electrically connect the lead screw with a variable point on the resistive strip which, in turn, is energized by a power source. By manipulating the lead screw, the point of contact between the wiper and the resistive strip is varied, thereby adjusting the input voltage to the varactor tuner.

However, the contact disclosed in the aforementioned application has a tendency, because it does not cooperate with any external portion of the turret other than the screw and the resistive strip, such as a guide groove or the like, to dislodge from its position between the strip and the screw and, thus, become dislocated, preventing the proper electrical connection between the lead screw and the resistive strip and perhaps jamming other portions of the mechanism. This is a great disadvantage as it requires that the controller be partially dismantled in order to provide access to the part which has to be repositioned.

One way in which to prevent the above-mentioned disadvantage is to provide the contact with a means of cooperating with some external portion of the controller, such as a guide element or the like, which serves to retain the contact in place. However, this requires additional mechanical structure located radially beyond the screw, complicating the mechanism, making assembly more difficult and, thus, more expensive and, in addition, necessitates the utilization of extra space. Further, such structure may obstruct the visibility of the position indicating member provided on each contact for calibration purposes.

The contact of the aforementioned application is also deficient in that it has no means of preventing relative lateral movement between the contact and the lead screw. Relative lateral movement between the contact and the lead screw may take place when the contact is positioned at either end of its permissible path of travel defined by the support for mounting the ends of the lead screw. The ends of the lead screw are journaled in flanges at either side of the turret. when the contact abuts the flange on one end and the screw is rotated in a manner which would otherwise cause the contact to move further in the direction towards that flange, a jamming and subsequent breakage of the contact may result. In order to overcome this difficulty, the structure of the lead screw and support components therefor may be manufactured in accordance with those disclosed in U.S. Pat. No. 3,866,479 to Carroll R. Miner, entitled TUNER DRIVE ASSEMBLY FOR SELECTING A LIMITED NUMBER OF CHANNELS IN THE UHF BAND, and assigned to the assignee herein.

That patent relates to a tuning drive assembly having a rotatable turret with first and second spaced end sections or flanges with a plurality of screw elements rotatably mounted therebetween. Each element has an externally threaded portion. An internally threaded member, normally engaging the externally threaded portion, is mounted thereon for axial movement along the externally threaded portion of the element as the element is rotated, in a manner similar to the wiper contact herein. The threaded portion of the element is spaced from both end sections such that the member is permitted to disengage or "runoff" the threaded portion at either end of its travel as the element is rotated, thus preventing breakage with damage of the member and the element. Means are provided which are effective, when disengagement occurs, to relatively move the member and the threaded portion together to cause reengagement thereof when the element is rotated in the opposite direction.

When "runoff" occurs, further turning of the lead screw in the same direction normally causes undesirable relative lateral oscillatory movement between the contact and the lead screw. It is preferable, therefore, to provide some means, on the contact, to eliminate this undesirable relative lateral movement.

It is, therefore, a prime object of the present invention to provide a contact for a turret-type varactor controller wherein dislogdement of the wiper contact is prevented to assure mechanical stability thereof without the necessity of additional external parts cooperating with the contact.

It is a second object of the present invention to provide a contact for use in a turret-type varactor controller wherein the position indicating member is readily visible and extends along substantially the entire width of the contact.

It is a further object of the present invention to provide a contact for use in a turret-type varactor controller wherein undesirable relative lateral movement between the lead screw and the contact during "runoff" is prevented.

It is another object of the present invention to provide a contact for use on a turret-type varactor controller which is deformable upon insertion between the lead screw and the resistive strip such that the appropriate electrical contact between the resistive strip and the lead screw is assured.

It is still another object of the present invention to provide a contact for use on a turret-type varactor controller wherein the deformation of the base portion thereof causes substantially balanced forces to be exerted on the lead screw by the guide portion and the thread engaging portion so as to further stabilize the contact.

In accordance with the present invention, a wiper contact is provided for use on a turret-type varactor controller of the type having a resistive strip located on the surface of the turret and a screw rotatably mounted on the turret at a location spaced from the resistive strip. The contact is deformable during insertion between the screw and the strip to assure continuous electrical contact therebetween and is movable along the screw as the screw is rotated. The contact comprises a thread engaging portion and a guide portion located at opposite ends of a resilient base portion. The structure of the guide portion is such that dislodgement of the contact is prevented without cooperation with any external part of the turret other than the strip and the screw, such that visibility of the position indicating member is unobstructed and access to the contact and, thus, assembly of the device, is facilitated.

The guide portion comprises a structure defining recess into which the screw is insertable to a substantial depth. A pair of spaced strip engaging contact points are formed extending outwardly from the side of the base portion opposite the side upon which the guide portion is located. The bottom of the recess, when the contact is viewed from the end thereof, is located between the contact points and, thus, will be spaced from the resistive strip a distance just slightly greater than the height of the contact points. Thus, the central angle formed between the imaginary lines drawn from the respective contact points through the axis of the screw is relatively large. This configuration assures mechanical stability of the contact and prevents the dislodgement thereof from its proper position.

Further, the contact comprises means for preventing lateral movement between the contact and the lead screw during "runoff". This means is mounted directly above the thread engaging portion on the support for the position indicating member, which extends across the top of the lead screw substantially along the entire length of the contact to enhance visibility thereof. The lateral movement preventing means comprises a pair of planar members extending on either side of the lead screw in a direction substantially parallel to the axis of the lead screw, such that the contact is held in a relatively constant lateral position with respect to the screw as radial movement of the screw occurs during "runoff".

The thread engaging portion and guide portion are mounted on opposite ends of the resilient base with the contact points located approximately midway therebetween. The base portion is deformable as the contact is inserted between the strip and the lead screw to assure continuous electrical contact therebetween. The resiliency of the base portion causes it to exert substantially equal forces on the guide portion and the screw engaging portion, respectively. The forces exerted on the thread engaging portion and the guide portion are, in turn, directed to the screw in a substantially balanced manner, also enhancing the stability of the contact.

To the accomplishment of the above and to such other objects as may hereinafter appear, the present invention relates to a contact for use in a turret-type varactor controller, as set forth in the annexed claims and described in the present specification, taken together with the accompanying drawings wherein like numerals refer to like parts and in which:

Figure 1:
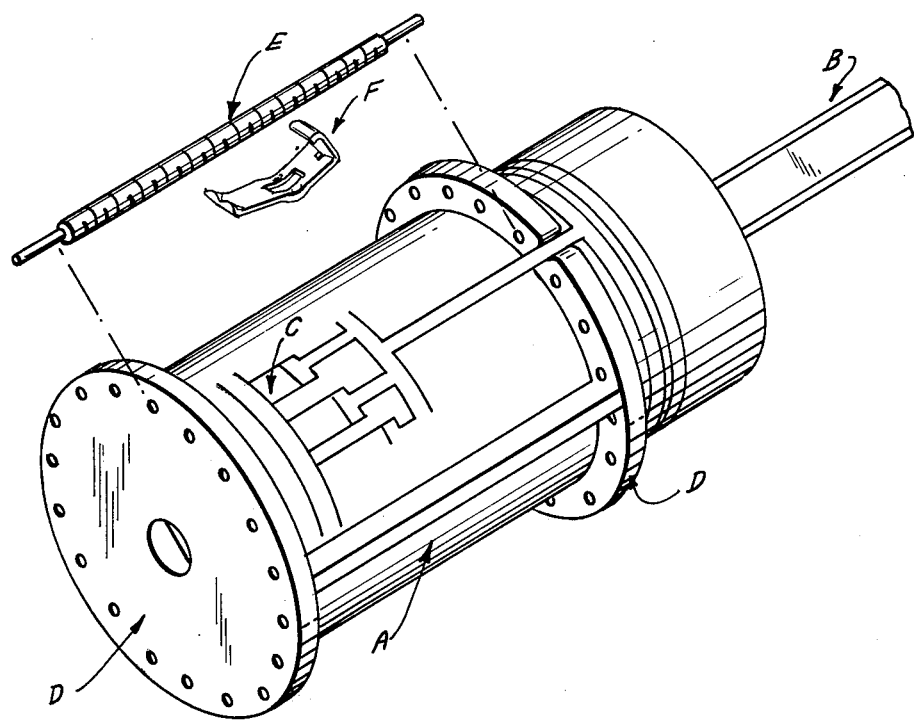
FIG. 1 is an exploded isometric view of a portion of a turret-type varactor controller showing the location of the wiper contact of the present invention therein.

FIG. 1 shows the turret or drum, generally designated A, of a turret-type varactor controller. Drum A is rotatably mounted within the controller by means of a shaft, generally designated B, extending therefrom which is rotatably mounted to a support, not shown. A plurality of resistive strips, generally designated C, are located on a insulating base on the external surface of turret A. Turret A is provided with a pair of end sections, or flanges, generally designated D, which have pairs of aligned apertures, each of which is adapted to receive the ends of an externally threaded rotatable lead screw, generally designated E, at a position spaced from, but in alignment with, each of the resistive strips C. A wiper contact, generally designated F, is insertable between each of the resistive strips C and the aligned lead screw E. Each of the resistive strips C may be electrically connected in parallel between a pair of conductors, also located on the base, which are energized by external source means (not shown). A single lead screw E, selected in accordance with the rotational position of the turret associated with the desired channel, is operably connected to the controller output circuit. The potential of this external circuit is determined by the relative position of the wiper contact, associated with the connected lead screw, along the resistive strip. Thus, it is the relative position of the wiper contact with respect to the corresponding resistive strip which determines the output voltage of the controller.

Figure 2:
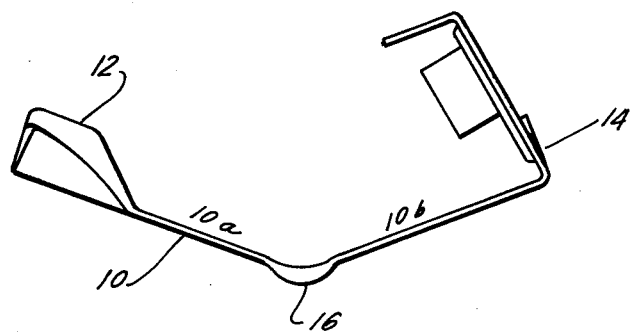
FIG. 2 is a side elevational view of the contact of the present invention prior to insertion into the controller.

FIG. 2 shows a side view of a wiper contact F of the present invention prior to insertion into the controller. The contact is preferably formed from a single planar metallic sheet which is cut into a rectangle and stamped into the desired configuration. The contact comprises a base portion 10, a guide portion 12 located at one end of the base portion 10, and a thread engaging portion 14, located at the other end of base portion 10. Approximately midway between the guide portion 12 and thread engaging portion 15, but on the opposite side of base portion 10, are formed a pair of spaced contact points 16, which are provided to make contact with the corresponding resistive strip in a manner which minimizes abrasion of the strip and provides proper electrical continuity as the contact is moved relative thereto.

In its undeformed form, the base portion 10 comprises a pair of substantially planar resilient parts 10a, 10b, extending outwardly from the central point on the base portion where contact points 16 are formed by a semicircular bend in the base portion. These planar members 10a, 10b form a obtuse angle with respect to each other in the undeformed position.

Figure 3:
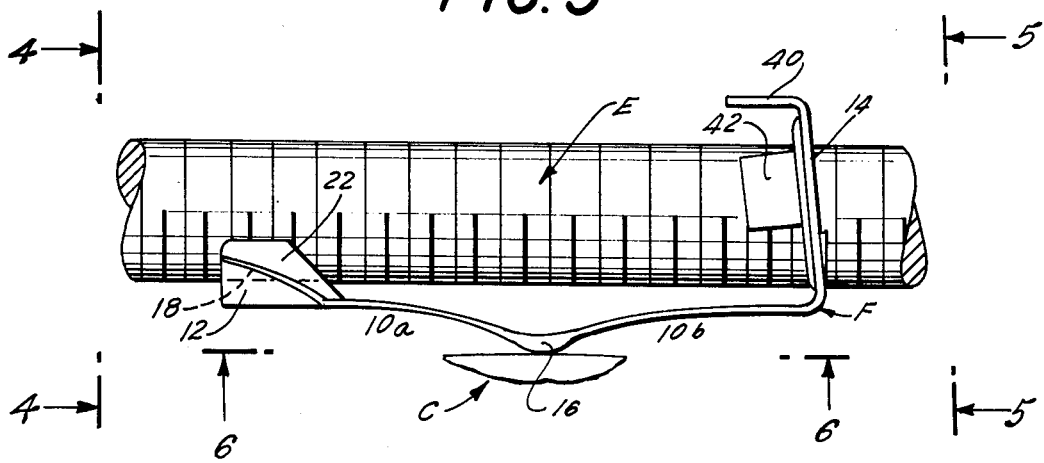
FIG. 3 is a view similar to FIG. 2, but showing the contact of the present invention after insertion into the controller.

As can be observed from FIG. 3, when the contact F is deformed by insertion between strip C and lead screw E, each of the previously planar members 10a, 10b take on a substantially curved configuration. The resiliency of these members causes the base portion to exert substantially equal forces on guide portion 12 and thread engaging portion 14 in order to maintain the proper electrical and physical connection between guide portion 12 and thread engaging portion 14, respectively, and lead screw E. Since the lengths of members 10a and 10b are substantially equal, the forces exerted by guide portion 12 and thread engaging portion 14 on the lead screw will be substantially balanced, thereby enhancing the mechanical stability of the contact.

Figure 4:
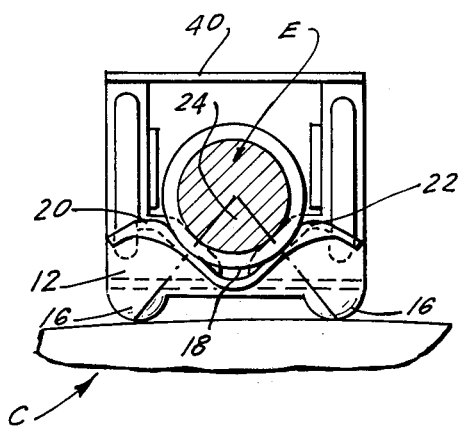
FIG. 4 is a cross-sectional view taken along line 4—4 of FIG. 3.

The structure of guide portion 12 can be best seen from FIG. 4. Guide portion 12 comprises a structure which defines a recess 18 into which the lead screw is receivable. The walls of recess 18 are substantially parallel to the axis of the lead screw when the wiper contact is in the deformed state, as shown in FIG. 3, such that engagement between the lead screw and the recess takes place over a substantial portion of the internal walls of the recess 18. Recess 18 is defined by a pair of spaced protrusions 20, 22 which maintain the lead screw therebetween. Portions 20, 22 extend above the plane of the base portion 10 almost half way along the diameter of the lead screw so that the lead screw can be seated within the recess to a considerable depth. The bottom of recess 18 is in the plane of the base portion 10 at a lateral position approximately half way between the sides of the base portion 10 and, thus, appears to be midway between contact points 16, as viewed in FIG. 4.

The structure of guide portion 12 is the means by which relative lateral movement between the contact F and the resistive strip C is prevented such that the contact cannot be dislodged from its proper position. This is accomplished, in part, by permitting the lead screw E to be seated deeply within the recess 18 at a point spaced only a relatively small distance from the resistive strip C. In addition, the separation of the contact points 16 in a wide stance on either side of the contact enhances the stability thereof.

The desirability of this structure can be demonstrated geometrically by considering an imaginary pair of lines (shown in phantom in FIG. 4), each extending from the axis of lead screw E to the outer end of one of the contact points 16. The central angle 24 which is defined by these imaginary lines determines, in large part, the mechanical stability of the contact. As shown in FIG. 4, central angle 24 is approximately a right angle. This is accomplished by providing a wide separation between contacts 16, as well as structuring recess 18, to permit lead screw E to be seated relatively close to resistive strip C. It should be appreciated that with such a large central angle 24, it is virtually impossible for contact F to rotate about the axis of the screw, thus moving laterally with respect to resistive strip C. This structure prevents the relative lateral movement between the contact and the resistive strip, thereby assuring that the contact cannot be inadvertently dislodged.

Figure 5:
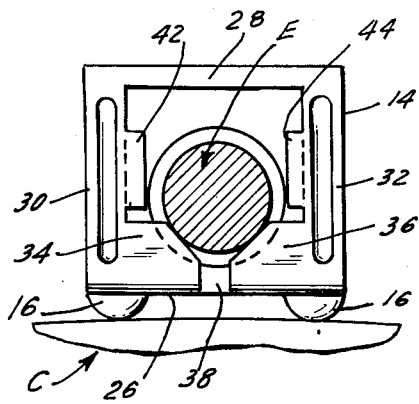
FIG. 5 is a cross-sectional view taken along line 5—5 of FIG. 2.

The structure of the thread engaging portion of the contact is best seen in FIG. 5. Thread engaging portion 14 comprises a substantially frame-like member, having a bottom portion 26, a top portion 28 and a pair of side portions 30 and 32. Bottom portion 26 is divided into a pair of thread engaging blades 34 and 36, connected by means of an intermediate portion 38. Blades 34 and 36 are received between the threads of lead screw E in a manner which will cause the lateral movement of contact F along lead screw E as the lead screw is rotated.

Figure 6:
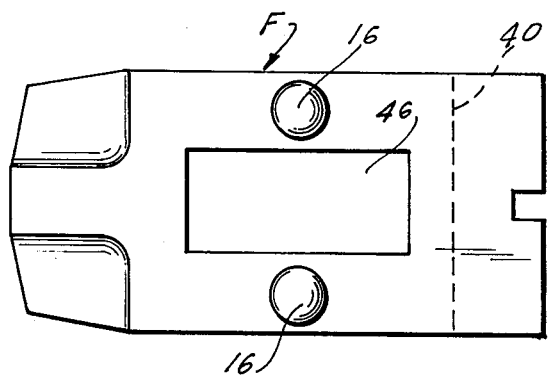
FIG. 6 is a bottom view taken along line 6—6 of FIG. 3.

The top portion 28 is provided with a substantially planar position indicating member 40, which extends over the top of lead screw E in a direction substantially parallel to the axis thereof. Position indicating member 40, as shown in FIG. 6, extends over substantially the entire width of contact F and, thus, is readily visible such that the relative position of the contact with respect to the resistive strip can be observed. Member 40 may be painted or otherwise colored to further enhance visibility thereof. In addition, because member 40 is connected to top part 28 along one entire side thereof, it is structurally stable and normally cannot accidentally be bent to interfere with the rotation of lead screw E.

Mounted on each of the side members 30 and 32 is a planar member 42, 44, respectively, which extend substantially parallel to the axis of lead screw E. Members 42 and 44 are located on each side of lead screw E, spaced a small distance therefrom. Members 42 and 44 form the means for preventing lateral movement between the screw and the contact during "runoff". Further, members 42 and 44, along with side member 30 and 32, provide extra structural rigidity to the thread engaging portion 14.

As can be seen from FIG. 6, the corners of the rear (left, as seen in the drawing) of the contact appear to have been removed, but this material has been taken up by the extra large protrusions 20 and 22 required in order to provide the necessary structural configuration of recess 18. Further, a central rectangular portion 46 has been removed from the contact to give the remaining structure the strength to be able to produce only the desired contact pressure.

It should, therefore, be appreciated that the present invention is a wiper contact for use on a varactor controller of the turret type which has enhanced mechanical stability. The guide portion thereof is structured to form a recess which receives the lead screw in a deeply seated manner so as to eliminate the possibility of relative lateral movement between the strip and the contact. In addition, the structure of the thread engaging portion is provided with means for preventing relative lateral movement between the contact and the screw during "runoff". Moreover, the contact is provided with a position indicating member which extends substantially the entire width of the contact and which is not obstructed by any structure normally required in cooperation with contacts of this type to provide stability.

While only a single embodiment of the present invention is disclosed herein for purposes of illustration, it is obvious that many variations and modifications can be made thereto. It is intended to cover all of these variations and modifications which fall within the scope of the invention as defined by the annexed claims.

What is claimed is:

1. A contact for use on a turret-type varactor controller of the type having a resistive strip mounted on the surface of said turret, a screw rotatably mounted on said turret at a location spaced from said strip, said contact being deformable to be inserted between said screw and said strip to assure electrical contact therebetween, said contact comprising thread engaging means and means for inhibiting movement of said thread engaging means relative to said turret surface in a direction tangential to said surface but permitting movement thereof relative to said surface in a direction radial to said surface, said inhibiting means comprising an aperture defined within said contact by said thread engaging means, side portions extending therefrom and a portion connecting said side portions, within which said screw is adapted to be received, said aperture having a tangential dimension substantially equal to the diameter of said screw and said connecting portion being normally spaced from said screw to form an aperture with a radial dimension substantially greater than the diameter of said screw, such that radial movement of said screw engaging means is permitted but tangential movement of said thread engaging means is inhibited, without cooperation with any external part of said turret other than said strip and said screw.

2. The contact of claim 1 wherein said recess is structured to permit insertion of a substantial portion of said screw and said contact further comprising a pair of spaced strip engaging contact points; the bottom of said recess, when the contact is viewed from the end thereof, being positioned between said contact points and spaced from said strip a distance only slightly greater than the height of said contact points.

3. The contact of claim 2 wherein the central angle formed between lines drawn from the outer ends of the respective contact points through the axis of said screw is approximately a right angle.

4. A contact for a turret-type varactor-controller of the type having a resistive strip located on the turret surface, and an externally threaded screw rotatably mounted on said turret at a position spaced from said strip, the contact being mounted between said strip and said screw, in electrical contact with each, and moveable along said screw in accordance with the rotation thereof, said contact comprising a base portion, a thread engaging portion mounted adjacent one end of said base portion, and a guide portion mounted adjacent the opposite end of said base portion, said thread engaging portion and said guide portion being mounted on one side of said base portion, and a laterally spaced contact point mounted on the other side of said base portion between said thread engaging portion and said guide portion, said thread engaging portion comprising thread engaging means extending from said base portion, first and second upstanding members mounted on said base portion, each of which is spaced from said screw, and a connecting member, mounted on said upstanding members and spaced from said screw, means, mounted on each of said upstanding members adjacent said screw, engageable with said screw to prevent lateral movement of said thread engaging portion relative to said screw and a position indicating member mounted on and extending from said connecting member.

5. The contact of claim 4 wherein said base portion comprises parts deformable upon the insertion of said contact between said screw and said strip.

6. The contact of claim 5 wherein said deformable parts, when deformed, exert substantially balanced forces on said guide portion and said thread engaging portion, respectively, after insertion thereof, said forces being directed toward said screw.

7. The contact of claim 5 wherein said deformable parts each extend from said contact point in a direction generally parallel with the axis of said screw, each of said parts having a substantially planar configuration prior to insertion and a curved configuration subsequent to insertion.

8. The contact of claim 7 wherein said parts form an obtuse angle in the undeformed state.

9. The contact of claim 4 wherein said guide portion comprises surfaces defining a recess into which said screw is receivable, said surfaces being substantially parallel to the screw surface subsequent to deformation of said contact.

10. The contact of claim 4 further comprising a pair of spaced contact points, and wherein the central angle formed between lines drawn from the axis of said screw and the contact points, respectively, when considered in end view, is approximately a right angle.

11. The contact of claim 4 wherein said thread engaging means, said upstanding members and said connecting member define an opening through which said screw is receivable.

12. The contact of claim 4 wherein said position indicating member is a planar member having a width substantially equal to the width of the connecting member.

13. The contact of claim 4 wherein said lateral movement preventing means comprises a pair of parallely situated spaced planar members, each of which extends from one of said upstanding members in a direction substantially parallel to the axis of said screw.

* * * * *